(12) United States Patent
Jakab et al.

(10) Patent No.: US 8,527,849 B2
(45) Date of Patent: Sep. 3, 2013

(54) HIGH SPEED HARD LDPC DECODER

(75) Inventors: Levente Peter Jakab, San Diego, CA (US); Dillip K. Dash, San Diego, CA (US)

(73) Assignee: STEC, Inc., Santa Ana, CA (US)

( * ) Notice: Subject to any disclaimer, the term of this patent is extended or adjusted under 35 U.S.C. 154(b) by 0 days.

(21) Appl. No.: 13/525,009

(22) Filed: Jun. 15, 2012

(65) Prior Publication Data

US 2013/0047052 A1    Feb. 21, 2013

Related U.S. Application Data

(60) Provisional application No. 61/525,705, filed on Aug. 19, 2011.

(51) Int. Cl.
*H03M 13/00*    (2006.01)

(52) U.S. Cl.
USPC .......................... 714/780; 714/763

(58) Field of Classification Search
USPC .................. 714/752, 786, 801, 763, 780
See application file for complete search history.

(56) References Cited

U.S. PATENT DOCUMENTS

| | | | | |
|---|---|---|---|---|
| 6,272,257 B1 * | 8/2001 | Prokop | .......................... | 382/246 |
| 7,673,223 B2 * | 3/2010 | Richardson et al. | .......... | 714/780 |
| 7,836,383 B2 * | 11/2010 | Efimov et al. | ................. | 714/780 |
| 7,895,500 B2 * | 2/2011 | Sun et al. | ....................... | 714/758 |
| 7,904,783 B2 * | 3/2011 | Brandman et al. | ............. | 714/755 |
| 7,971,130 B2 * | 6/2011 | Ramamoorthy | ............... | 714/785 |
| 8,055,979 B2 * | 11/2011 | Wu et al. | ........................ | 714/773 |
| 8,145,984 B2 * | 3/2012 | Sommer et al. | ................ | 714/797 |
| 8,151,163 B2 * | 4/2012 | Shalvi et al. | ................... | 714/758 |
| 8,156,398 B2 * | 4/2012 | Sommer | ........................ | 714/752 |
| 8,156,403 B2 * | 4/2012 | Shalvi et al. | ................... | 714/764 |
| 8,243,511 B2 * | 8/2012 | Patapoutian et al. | ..... | 365/185.02 |
| 2011/0029756 A1 * | 2/2011 | Biscondi et al. | ................ | 712/22 |

* cited by examiner

*Primary Examiner* — Esaw Abraham

(74) *Attorney, Agent, or Firm* — McDermott Will & Emery LLP

(57) ABSTRACT

The subject disclosure describes a method for performing error code correction, the method includes, loading a code word including a plurality of encoded bits into a memory array, initializing, into one or more of a plurality of memory units, a plurality of bits associated with each of the encoded bits, wherein the plurality of bits initialized for each of the encoded bits is based on a value of the associated encoded bit and wherein the plurality of encoded bits and the plurality of bits initialized for each of the encoded bits includes soft information. In certain aspects, the method further includes decoding the code word using the soft information and outputting the decoded code word from the memory array. A decoder and flash storage device are also provided.

18 Claims, 3 Drawing Sheets

HIGH SPEED HARD LDPC DECODER

This application claims the benefit of U.S. Provisional Application No. 61/525,705, filed Aug. 19, 2011, entitled "HIGH SPEED LDPC DECODER," the entirety of which is incorporated herein by reference.

BACKGROUND

The subject disclosure relates to data storage devices, such as solid-state drives (SSDs), that use low-density parity-check (LDPC) codes for error correction.

In conventional LDPC decoding systems, soft information for one or more code words must be read into the decoder before error correction processing can be performed. The time delay associated with reading soft information into the decoder can contribute to inefficient decoder operation.

SUMMARY

In some aspects, the subject technology comprises a computer-implemented method for performing error code correction, the method comprising, loading a code word comprising a plurality of encoded bits into a memory array, initializing, into one or more of a plurality of memory units, a plurality of bits associated with each of the encoded bits, wherein the plurality of bits initialized for each of the encoded bits is based on a value of the associated encoded bit and wherein the plurality of encoded bits and the plurality of bits initialized for each of the encoded bits comprises soft information. In certain aspects, the method further comprises steps for decoding the code word using the soft information, wherein the decoding comprises performing a plurality of decoding cycles and outputting the decoded code word from the memory array.

In other aspects, the subject technology comprises a decoder for performing error correction on payload data, the decoder comprising, a top bit array configured to store a code word comprising a plurality of encoded bits, a plurality of memory units configured to store a plurality of bits initialized for each of the encoded bits and a plurality of processing units, wherein each of the processing units is coupled to the top bit array and to at least one of the plurality of memory units, and wherein each of the processing units is configured to perform a plurality of decoding cycles for decoding soft information comprising the plurality of encoded bits and the plurality of bits initialized for each of the encoded bits.

The disclosed subject matter also relates to a flash storage device comprising a flash memory array, a controller and a decoder coupled to the flash memory array and the controller, the decoder further comprising: a top bit array configured to store a code word comprising a plurality of encoded bits, a plurality of memory units configured to store a plurality of bits initialized for each of the encoded bits and a plurality of processing units, wherein each of the plurality of processing units is coupled to the top bit array and to at least one of the plurality of memory units, and wherein each of the processing units is configured to perform a plurality of decoding cycles for decoding soft information comprising the plurality of encoded bits and the plurality of bits initialized for each of the encoded bits.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

DETAILED DESCRIPTION

Figure 1:
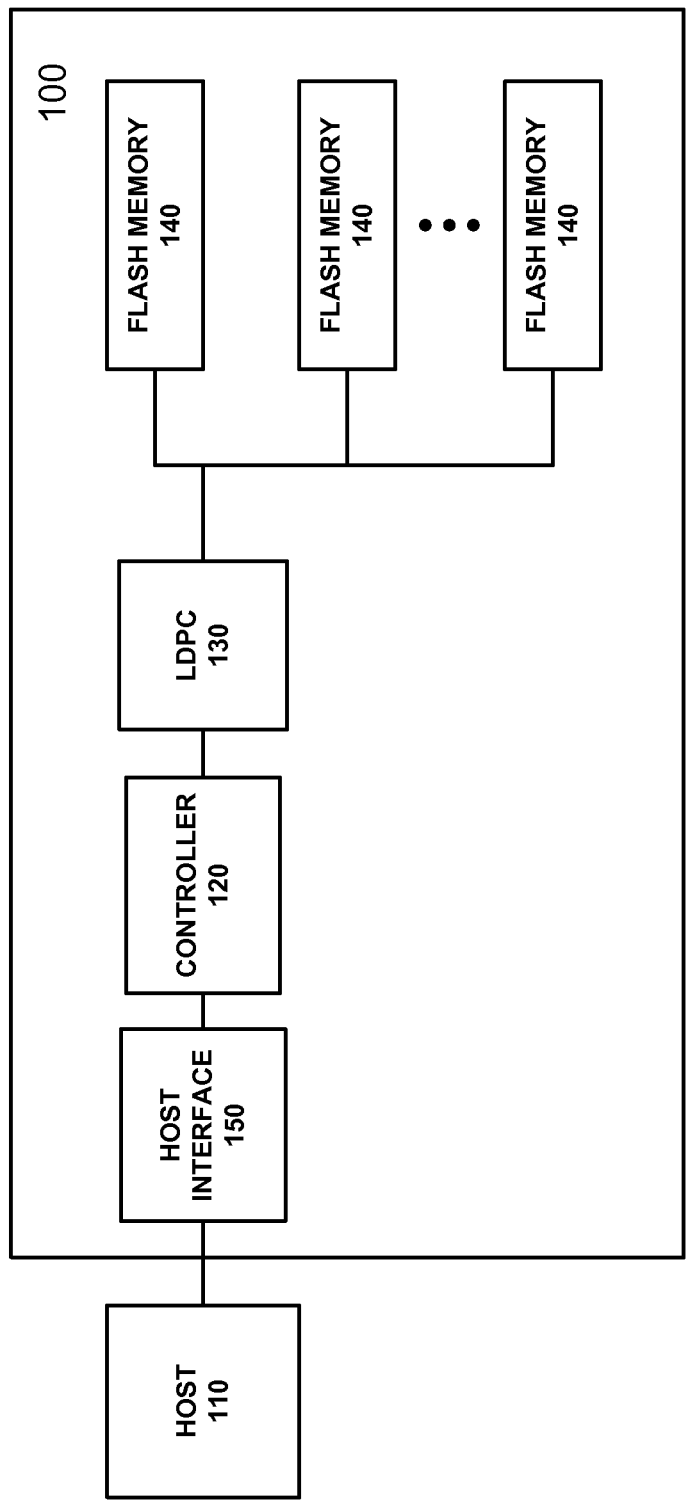
FIG. 1 is a block diagram illustrating components of a flash memory device according to one aspect of the subject technology.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology. Like components are labeled with identical element numbers for ease of understanding.

The subject disclosure describes a decoder for use in performing error correction on encoded data (e.g., "encoded code words") stored in a memory device (e.g., a flash memory array). In some implementations, the decoder comprises a hard LDPC decoder for performing error correction processing on one or more code words retrieved by a controller from a flash memory array. The decoder includes a memory array for storing the bits of an encoded code word, as well as a plurality memory units and a plurality of processing units. In certain aspects, the memory array (i.e., the "top bit array") can comprise an array of 1-bit flip-flops.

In practice, encoded data (e.g., bits of one or more encoded code words) stored in the flash memory array are retrieved by the controller. These "hard bit values" of the one or more encoded code words are then read into the top bit array of the decoder. Subsequently, soft information is initialized for each bit of the encoded code word by mapping the hard bit values of the encoded code word into soft information, where the respective hard bit values become sign bits for soft information comprising the hard bit value and the soft information. As will be discussed in further detail below, five bits of soft information can be initialized for each hard bit value and stored in one or more memory units (e.g., one or more "variable node memory units") of the decoder, whereas the sign bits remain in the top bit array.

By initializing soft information for each bit of the encoded code word in the memory units, the subject technology does not necessitate separately reading soft information into the memory units from outside of the decoder. As such, reading in an encoded code word only requires enough clock cycles to read the encoded code word into the top bit array. Although the actual size of an encoded code word (and the size of the top bit array may) vary depending on implementation, by avoiding the need to separately read soft information into the decoder, the subject technology improves code word load times compared to conventional decoder designs for code words of similar lengths.

After soft information has been initialized for each encoded code word bit in the top bit array, error correction processing (i.e., "decoding") can be performed (e.g., by the plurality of processing units) using the soft information. For example, the processing units can be configured to perform error correction using soft information that includes the soft information initialized for each encoded code word bit in the memory units, as well as information stored in the top bit array (which will initially include the encoded code word bits of the code word read from the flash memory array). Using the above example, wherein five bits of soft information are initialized for each encoded code word bit, decoding will be performed on a total of six bits of soft information (e.g., five initialized bits and one code word bit) for each bit of the encoded code word.

Error correction processing may comprise multiple decoding cycles. As the decoding cycles are performed, the values of the soft information bits are iteratively updated to reflect new values. Thus, as the decoding cycles are performed, the soft information stored in the top bit array and the decoder memory units is updated. For example, as it is determined (through error correction processing) that certain soft information values should be changed, the soft information in the top bit array and/or the information in the plurality of memory units is modified accordingly. Once decoding is completed, the bits stored in the top bit array represent the error-corrected code word e.g., the decoded version of the encoded code word originally read into the top bit array. Outputting of the error corrected code word comprises reading out only the resulting decoded bit values in the top bit array, and not the soft information stored in the various memory units. Thus, outputting of the decoded code word may only require enough clock cycles to read out the values stored in the top bit array.

As compared to conventional decoding techniques, the subject technology requires fewer clock cycles to read encoded code words into (and decoded code words out of) the decoder. By way of the above example, error correction processing for each code word bit can be performed for six bits of soft information (e.g., one bit in the top bit array plus five bits initialized in the corresponding memory unit) wherein only one bit for each code word bit is actually read into (and read out of) the decoder. As such, in some implementations, the subject technology reduces the amount of delay incurred when inputting encoded code words and outputting decoded code words.

FIG. 1 is a block diagram illustrating components of a flash memory device 100 according to one aspect of the subject technology. As depicted in FIG. 1, a host 110 is coupled to the flash memory device 100 via a host interface 150. The flash memory device includes a data storage controller 120, a low-density parity-check (LDPC) module 130, and an array of flash memory 140. Further depending on implementation, the elements of the flash memory device 100 can be integrated into a single chip or implemented in two or more discrete components.

The controller 120 may be implemented with a general-purpose microprocessor, a microcontroller, a digital signal processor (DSP), an application specific integrated circuit (ASIC), a field programmable gate array (FPGA), a programmable logic device (PLD), a controller, a state machine, gated logic, discrete hardware components, or a combination of the foregoing. One or more sequences of instructions may be stored as firmware on a ROM within the controller 120. One or more sequences of instructions also may be software stored and read from another storage medium, such as the flash memory array 140, or received from a host device (e.g., the host 110) via a host interface 150. ROM, storage mediums, and flash memory arrays represent examples of machine or computer readable media on which instructions/code executable by the controller. Machine or computer readable media may generally refer to any medium or media used to provide instructions to the controller 120, including both volatile media, such as dynamic memory used for storage media or for buffers within the controller 120, and non-volatile media, such as electronic media, optical media, and magnetic media.

The host interface 150 may be configured to implement a standard interface, such as Serial-Attached SCSI (SAS), Fiber Channel interface, PCI Express (PCIe), SATA, USB, and the like. The host interface 150 may be configured to implement only one interface. Alternatively, the host interface 150 may be configured to implement multiple interfaces, which are individually selectable using a configuration parameter selected by a user or programmed at the time of assembly. The host interface 150 can include one or more buffers for buffering transmissions between a host device and the controller. A host device (e.g., the host 110) may be any device configured to be coupled to the data storage system and to store data in data storage system. In some examples, the host device may be a computing system such as a personal computer, a server, a workstation, a laptop computer, PDA, smart phone, and the like. Alternatively, the host device may be an electronic device such as a digital camera, a digital audio player, a digital video recorder or the like.

The flash memory array 140 represents non-volatile memory devices for storing data. By way of example, the flash memory array 140 may comprise a single-level cell (SLC) memory, a multi-level cell (MLC) memory or an three-level cell (TLC) memory device. In some aspects, the flash memory array 140 may comprise one or more hybrid memory devices that can function in one or more of a SLC, MLC or TLC mode.

Each component of the flash memory array 140 can include a single flash memory device or chip, or may include multiple flash memory devices or chips arranged in multiple channels, as depicted in FIG. 1. However, the flash memory is not limited to any particular capacity or configuration. For example, the number of cell states, the number of physical blocks, the number of physical pages per physical block, the number of sectors per physical page, and the size of the sectors can vary within the scope of the subject technology.

The LDPC module 130 represents one or more components configured to generate LDPC code words to be stored in the flash memory array 140 from data received from the host 110 and to decode LDPC code words read from the flash memory array 140 before sending the decoded data to the host 110. In some implementations, the LDPC module can comprise one or more memory devices and/or one or more processing units used to perform error correction, as described in further detail below.

Figure 2:
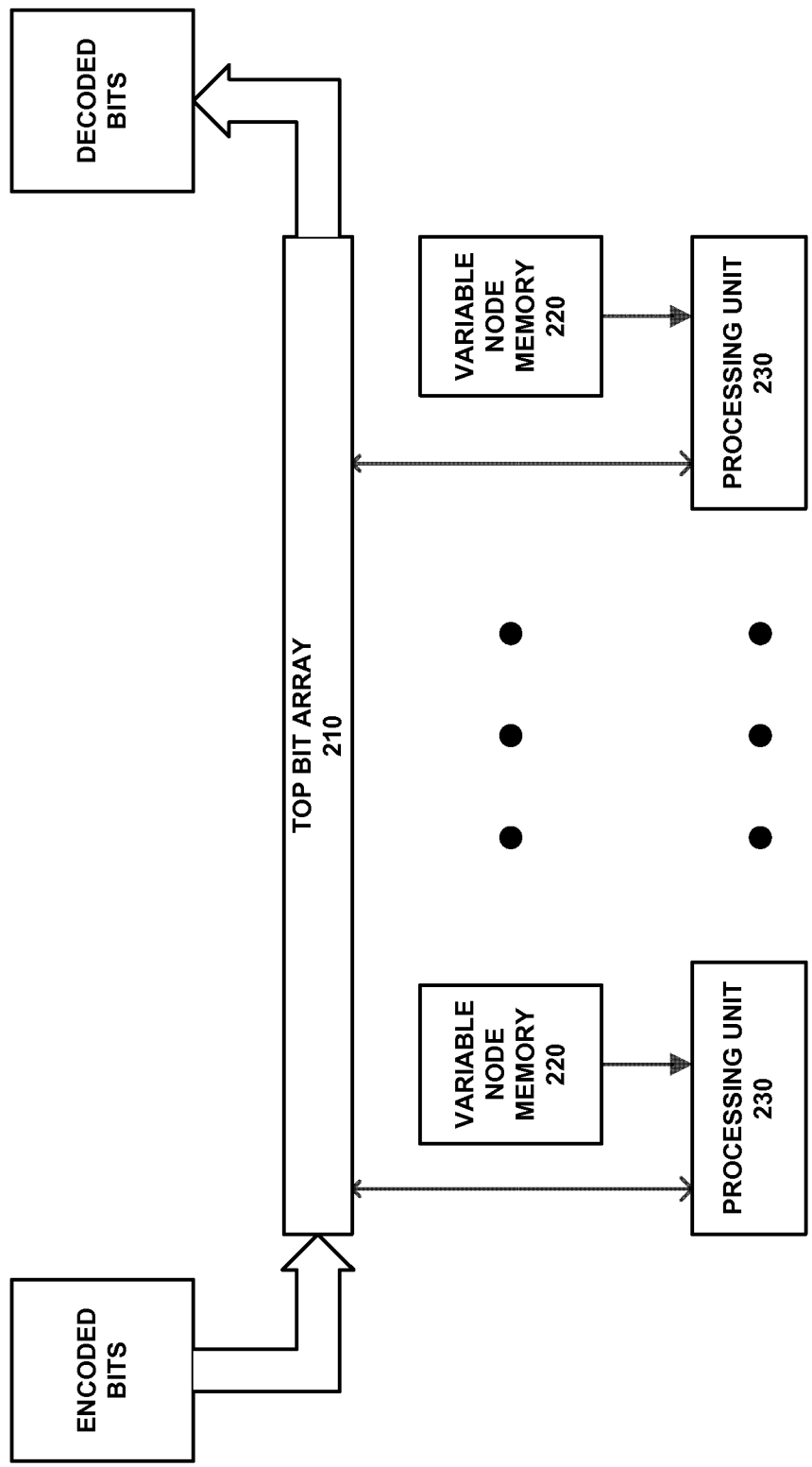
FIG. 2 is a block diagram illustrating an example of components of a LDPC module, according to one aspect of the subject technology.

FIG. 2 is a block diagram illustrating an example of components of a LDPC decoder module 200, according to one aspect of the subject technology. As depicted in FIG. 2, the LDPC decoder module 200 includes a top bit array 210, a plurality of variable node memory units 220 and a plurality of processing units 230. In the example of FIG. 2, the top bit array 210 is coupled to each of the plurality of processing units 230. Further, each of the plurality of variable node memory units 220 are coupled to each of the plurality of processing units 230. In some implementations, the processing units 230 will be configured to both receive information from and send information to, the top bit array 210. Similarly, the processing units 230 can be configured to send information to (and receive information from) the variable node memory units 220. Although the top bit array 210 can comprise any suitable memory device, in certain aspects the top bit array 210 is implemented using an array of single-bit flip-flops.

The number of flip-flops in the top bit array 210, the number of variable node memories 220, and the number of processing units 230, can vary depending on the LDPC implementation. The variable node memories 220 are configured to store soft information bits that are initialized based on the encoded data (e.g., code word bits) initially read into the top bit array 210. Additionally, the processing units 230 are configured to store updated soft information bits during the course of error correction processing. For example, updated soft information bits may be stored by the processing units 230, to the top bit array 210 and/or the variable node memory units 220.

In practice, hard encoded bit values (e.g., encoded code word bits) are retrieved from the flash array, for example, by the controller. As such, the retrieved code word bits represent "hard bit" values that are initially unassociated with soft information. Although the length of the encoded code word can vary depending on implementation, in some examples the encoded code word will have a length of 9,216 bits. After the hard encoded bit values have been retrieved from the flash array, the encoded code word bits are read into the top bit array 210. Soft information bits are then initialized in the variable node memory units 220 for each bit read into the top bit array 210.

Although initialization of soft information values may vary depending on implementation, initialization of soft information for any particular code word bit can be based on the value (sign) of the code word bit. By way of example, a code word bit value of 1 can be mapped to an initialized soft bit binary sequence of 100001 (corresponding with a decimal value of −31). Similarly, a code word bit value of 0 can be mapped to an initialized soft bit sequence of 011111 (corresponding with a decimal value of 31). By initializing the soft information bits into the variable node memory units 220 (and thereby avoiding the need to separately read soft information bits into the LDPC decoder module 200), the subject technology provides a way by which the code word bits can be read into the LDPC decoder module 200 (and error correction processing can begin) in a relatively short time period, as compared to conventional LDPC decoder designs.

After soft information bits have been initialized in the variable node memories 220, error correction can be performed using all available soft information stored in the top bit array 210 and the variable node memory units 220 using the processing units 230. As error correction proceeds, the soft information is updated/maintained during decoding cycles, including the soft information stored in the top bit array 210.

Once error correction processing has completed, the updated soft information contained in the top bit array 210 will comprise the error corrected (decoded) code word i.e., the error corrected version of the code word initially read into the top bit array 210. The error corrected code word is then read out of the top bit array 210; however, none of the soft information stored in the variable node memory units 220 need be read out of the LDPC decoder module 200. Rather, when a subsequent code word is read in (e.g., from the flash array), the soft information values stored in the variable node memory units 220 are re-initialized based on the corresponding code word bits of the newly read code word.

Because soft information bits in the variable node memory units 220 are initialized/re-initialized in the variable node memories (as opposed to being read in and/or read out of the LDPC decoder module 200), the reading in of an encoded code word and outputting of a decoded code word, can be performed in a relatively short time period as compared to conventional LDPC designs.

Figure 3:
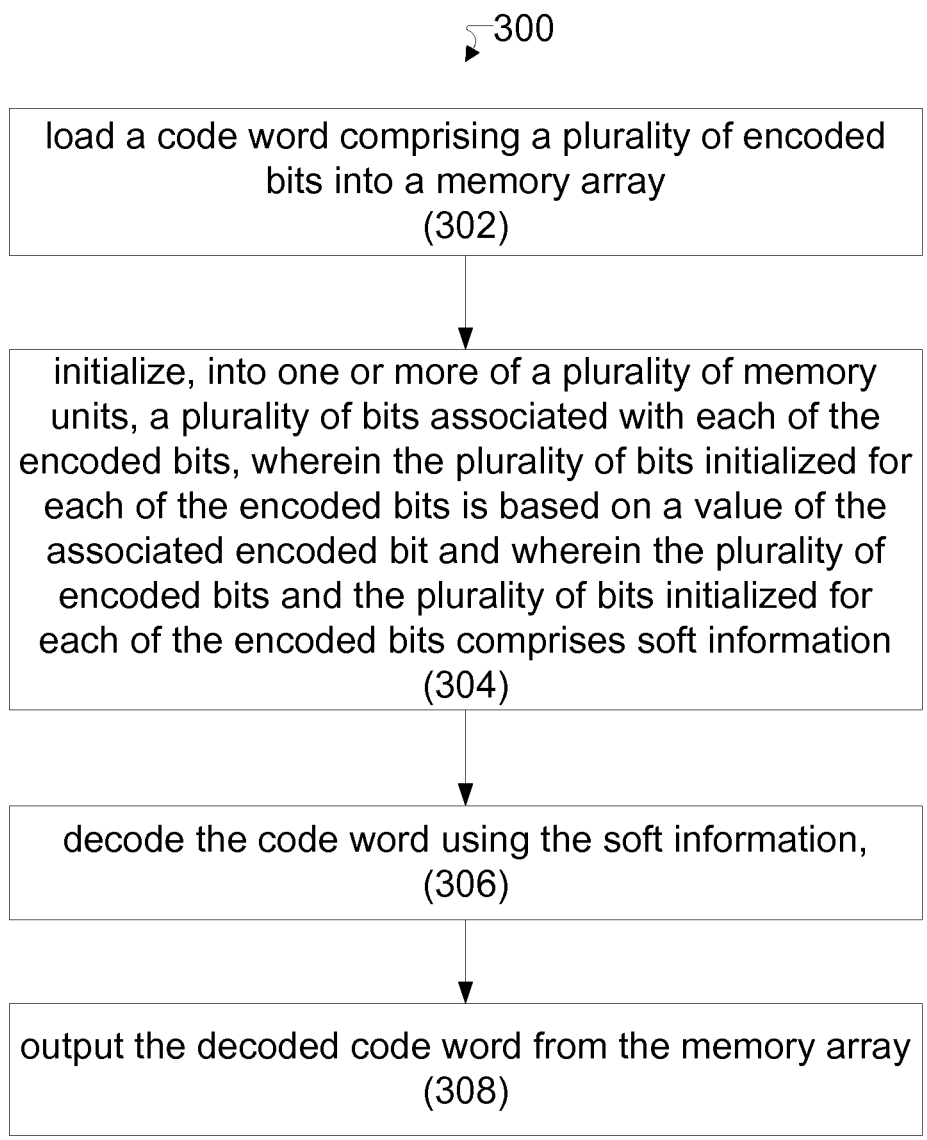
FIG. 3 is a flowchart of an example method for implementing aspects of the subject technology.

FIG. 3 is a flowchart of an example method 300 for implementing aspects of the subject technology. The method 300 begins with step 302, in which a plurality of encoded bits is loaded into a memory array. The encoded bits each correspond to an encoded code word bit, for example, for an encoded code word retrieved from memory (e.g., a flash memory array 140 as discussed above in FIG. 1). Subsequently, the encoded code word bits are read into a memory array. The memory array can comprise any type of memory device; however, in certain implementations, the memory array comprises an array of single bit flip flops. Accordingly, in some aspects, a single encoded code word bit may be stored in each of the single bit flip flops (e.g., as "top bits"). The size of the memory array and the length of the encoded code word can vary depending on implementation; however, in some examples the memory array will be of sufficient length to accommodate an encoded code word of 9,216 bits in length.

In step 304, a plurality of bits associated with each of the encoded bits is initialized, wherein the plurality of bits initialized for each of the encoded bits is based on a value of the associated encoded bit. As discussed above, the plurality of initialized bits associated with each of the encoded bits (e.g., each of the encoded code word bits) comprise soft information based on the value (sign) of the corresponding code word bit. The initialization of soft information will depend on LDPC implementation; however, in certain aspects five bits of soft information is initialized for each hard bit of the corresponding encoded code word initially read into the memory array. The mapping between a particular code word bit and the corresponding initialized soft information bits will also depend on LDPC implementation. As discussed above with respect to FIG. 2, the soft information values (e.g., the five soft bit values) initialized for any particular code word bit can depend on the value (sign) of the code word bit. For example, a code word bit value of 1 can be mapped to an initialized soft bit binary sequence of 100001 (corresponding with a decimal value of −31). Similarly, a code word bit value of 0 can be mapped to an initialized soft bit sequence of 011111 (corresponding with a decimal value of 31).

Because soft information bits are initialized, rather than separately read into the decoder (e.g., the LDPC module 200), the reading in of an encoded code word can be performed in a relatively short time period, as compared to conventional LDPC designs, which separately read all soft information into various memory devices of the decoder.

In step 306, a code word is decoded using the soft information, wherein the soft information comprises the plurality of encoded bits (e.g., the code word bits read into the top bit array) and the plurality of bits initialized for each of the encoded bits. Error correction processing is performed using one or more processing units (e.g., the processing units 230) as discussed above with respect to FIG. 2. In some implementations, soft information for error correction processing is received by the one or more processing units from one or more variable node memory units and a top bit array (e.g., the variable node memory units 220 and the top bit array 210). As error correction processing (decoding) is performed, the soft information in the one or more variable node memory units and/or the top bit array is continuously updated. After decoding has completed, the soft information bits stored in the top bit array will comprise an error corrected (decoded) version of the encoded code word initially read into the top bit array.

In step 308, a plurality of decoded bits from the memory array are outputted, wherein the plurality of decoded bits comprises one or more of the encoded bits that have been error-corrected by decoding the soft information. As discussed above, the outputting of the error corrected code word in the memory array (e.g., the top bit array) can be accomplished by outputting only the information stored in the memory array, without the need for outputting the soft information stored in the one or more variable node memory units. As such, the process of outputting a decoded code word can be performed in a relatively short time period, as compared to conventional LDPC designs that read out all soft information bits. By way of comparison, in certain implementations the subject technology can output a given code word in approximately 32 clock cycles, as compared to 1152 clock cycles for a similarly sized code word (e.g., a code word of 9,216 bits in length), using a conventional LDPC implementation.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

What is claimed is:

1. A computer-implemented method for performing code word decoding, the method comprising:
    loading a code word comprising a plurality of encoded bits into a memory array;
    initializing, into one or more of a plurality of memory units, a plurality of bits associated with each of the encoded bits, wherein the plurality of bits initialized for each of the encoded bits is based on a value of the associated encoded bit and wherein the plurality of encoded bits and the plurality of bits initialized for each of the encoded bits comprises soft information;
    decoding the code word using the soft information; and
    outputting the decoded code word from the memory array, without outputting the plurality of bits from the plurality of memory units.

2. The method of claim 1, wherein initializing the plurality of bits associated with each of the encoded bits further comprises:
    setting initial values for each of the plurality of bits based on a predetermined mapping corresponding with the value of the associated encoded bit.

3. The method of claim 1, wherein each of the plurality of memory units comprises a variable node memory.

4. The method of claim 1, wherein decoding the code word comprises LDPC decoding.

5. The method of claim 1, wherein decoding the code word further comprises:
    updating a value of one or more of the encoded bits in the memory array after each of a plurality of decoding cycles.

6. The method of claim 1, wherein the memory array comprises an array of flip-flops.

7. A decoder for performing error correction on payload data, the decoder comprising:
    a top bit array configured to store a code word comprising a plurality of encoded bits;

a plurality of memory units configured to store a plurality of bits initialized for each of the encoded bits; and a plurality of processing units, wherein each of the processing units is coupled to the top bit array and to at least one of the plurality of memory units, and wherein the plurality of processing units are configured to decode the code word using soft information comprising the plurality of encoded bits and the plurality of bits initialized for each of the encoded bits.

8. The decoder of claim 7, wherein the plurality of bits initialized for each of the encoded bits are based on a predetermined mapping.

9. The decoder of claim 7, wherein each of the plurality of processing units are configured to update the soft information, based on one or more of the decoding cycles.

10. The decoder of claim 7, wherein the plurality of processing units are configured to decode the code word using LDPC decoding.

11. The decoder of claim 7, wherein the memory array comprises an array of flip-flops.

12. The decoder of claim 7, wherein each of the plurality of memory units comprises a variable node memory.

13. A flash storage device, comprising:
a flash memory array;
a controller; and
a decoder coupled to the flash memory array and the controller, the decoder further comprising:

a top bit array configured to store a code word comprising a plurality of encoded bits;

a plurality of memory units configured to store a plurality of bits initialized for each of the encoded bits; and a plurality of processing units, wherein each of the plurality of processing units is coupled to the top bit array and to at least one of the plurality of memory units, and wherein each of the processing units is configured to decode the code word using soft information comprising the plurality of encoded bits and the plurality of bits initialized for each of the encoded bits.

14. The flash storage device of claim 13, wherein the plurality of bits initialized for each of the encoded bits is based on a predetermined mapping.

15. The flash storage device of claim 13, wherein each of the plurality of processing units are configured to update the code word after each of a plurality of decoding cycles.

16. The flash storage device of claim 13, wherein each of the processing units is configured to decode the code word using LDPC decoding.

17. The flash storage device of claim 13, wherein the memory array comprises an array of flip-flops.

18. The flash storage device of claim 13, wherein each of the plurality of memory units comprises a variable node memory.

* * * * *